United States Patent [19]
Urano et al.

[11] Patent Number: 5,879,448
[45] Date of Patent: Mar. 9, 1999

[54] CRYSTAL PULLING METHODS AND APPARATUS

[75] Inventors: Masahiko Urano, Takasaki; Yasushi Nakamura; Seiichiro Otsuka, both of Tomioka; Eiichi Iino, Annaka, all of Japan

[73] Assignee: Shin-Etsu Handotai Co., Ltd., Tokyo, Japan

[21] Appl. No.: 883,046

[22] Filed: Jun. 26, 1997

[30] Foreign Application Priority Data

Jul. 23, 1996 [JP] Japan .................................. 8-212055

[51] Int. Cl.⁶ .................................................. C30B 15/32
[52] U.S. Cl. .............................. 117/13; 117/35; 117/208; 117/218
[58] Field of Search ............................ 117/13, 208, 35, 117/218

[56] References Cited

U.S. PATENT DOCUMENTS

| | | | |
|---|---|---|---|
| 5,126,113 | 6/1992 | Yamagishi | 117/208 |
| 5,441,014 | 8/1995 | Tomioka | 117/208 |
| 5,487,355 | 1/1996 | Chiou | 117/13 |

FOREIGN PATENT DOCUMENTS

| | | |
|---|---|---|
| 0286133 | 10/1988 | European Pat. Off. . |
| 0449260 | 10/1991 | European Pat. Off. . |
| 0781875 | 7/1997 | European Pat. Off. . |
| 9-2893 | 1/1997 | Japan . |
| A 9-2893 | 1/1997 | Japan . |

*Primary Examiner*—Robert Kunemund
*Attorney, Agent, or Firm*—Oliff & Berridge, PLC

[57] ABSTRACT

A method and an apparatus for pulling a single crystal are disclosed. A first neck portion, a convex portion, and a second neck portion are formed in this order under a seed crystal held by a seed chuck, and subsequent to the second neck portion, a single crystal having a diameter-expanding portion and a straight cylindrical portion is formed. Lifting holders are brought around and in proximity to the second neck portion when the second neck portion rises to a predetermined position during the pulling by the seed chuck. The single crystal and the lifting holders are moved relative to each other in the vertical direction to thereby bring the convex portion into contact with the lifting holders in a resting manner, so that part of a load borne by the seed chuck is shifted to the lifting holders. Subsequently, the pulling operation is performed by the lifting holders. Accordingly, a single crystal having a larger weight can be pulled safely while maintaining high quality.

16 Claims, 6 Drawing Sheets

CRYSTAL PULLING METHODS AND APPARATUS

BACKGROUND OF THE INVENTION

1. Field of the Invention

The present invention relates to a crystal pulling method and apparatus employing the Czochralski method (the CZ method), and particularly to improvements for safe manufacture of heavy single crystals of high quality.

2. Description of the Related Art

Regarding a method of pulling a single crystal from a melt of a semiconductor material, such as silicon, contained in a crucible, the present inventors have proposed an improved pulling technique as described in, for example, Japanese Patent Application No. 7-256892.

Figure 6:
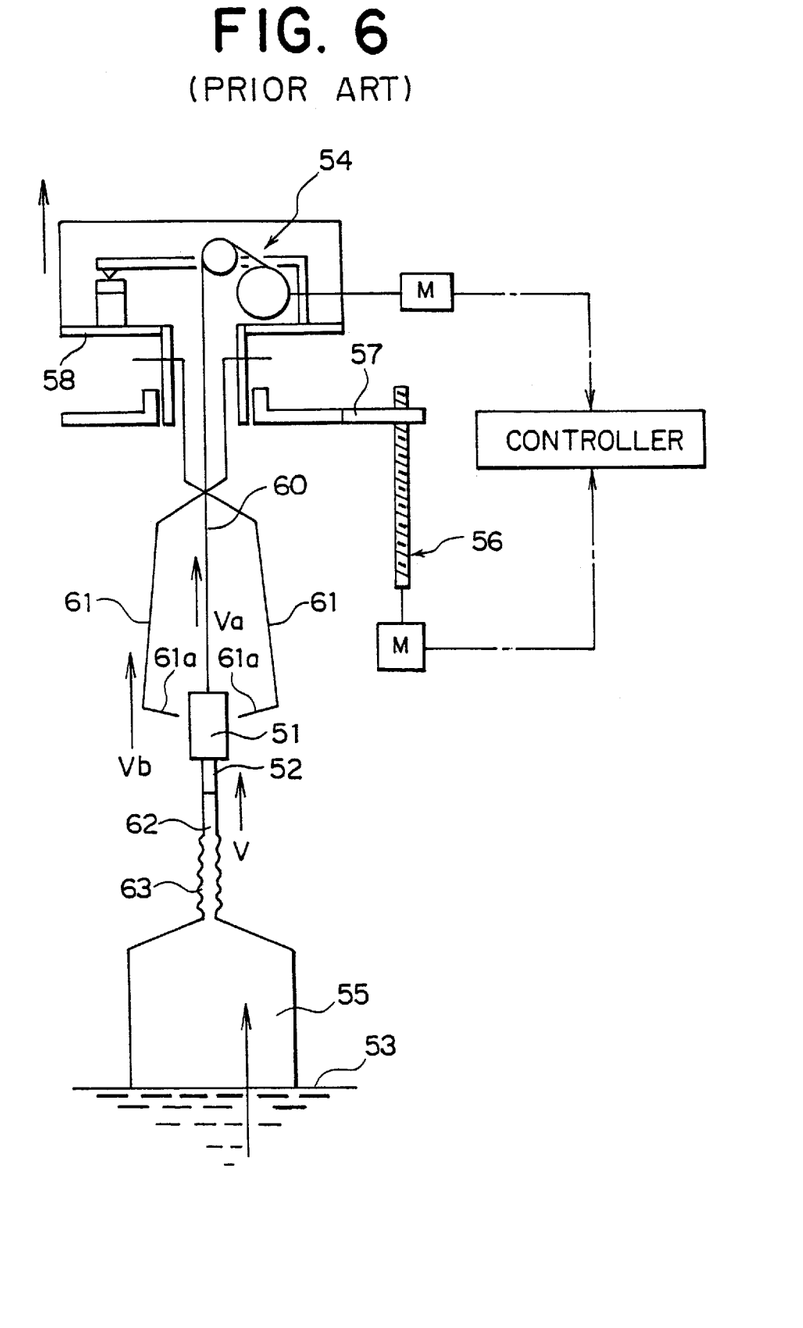
FIG. 6 is a schematic view showing a conventional crystal pulling apparatus.

As shown in FIG. 6, according to this technique for pulling a single crystal, a manufacturing method for growing a single crystal portion 55, comprising the steps of bringing a seed crystal 52 held by a seed chuck 51 into contact with a material melt 53 and pulling the seed chuck 51 by a seed chuck lifting mechanism 54, is performed through use of an apparatus having the following structure.

A retaining case 58 rotatable about a vertical axis is mounted on a slider 57 which is vertically moved by a slider moving mechanism 56. The seed chuck lifting mechanism 54 is provided in the retaining case 58 so as to pull the seed chuck 51 by means of a wire 60. The retaining case 58 is equipped with lifting holders 61 which have engagement portions 61a at the bottom end thereof. Thus, the single crystal portion 55 is pulled through use of both the seed chuck 51 and the lifting holders 61.

That is, initially, with the slider 57 fixed at a certain position, the seed crystal 52 held by the seed chuck 51 is brought into contact with the material melt 53, and subsequently the seed chuck 51 is pulled by the seed chuck lifting mechanism 54 while the retaining case 58 is being rotated, to thereby form a neck portion 62, a corrugated portion 63, and the single crystal portion 55, in this order subsequent to the seed crystal 52. Then, when the corrugated portion 63 rises to a predetermined position, the lifting holders 61 operate so that the engagement portions 61a engage a concave section of the corrugated portion 63. Subsequently, the slider moving mechanism 56 operates to start raising the slider 57.

At this time, control is performed such that the sum of the rising speed of the slider 57 and the rising speed of the seed chuck 51 relative to the slider 57 becomes identical to the previous rising speed of the seed chuck 51 as measured when solely the seed chuck 51 was engaged in pulling. The rising speed of the slider 57 gradually increases, and accordingly that of the seed chuck 51 gradually decreases. Finally, the rising speed of the seed chuck 51 relative to the slider 57 becomes zero, after which the pulling is completely performed by the lifting holders 61.

Such a pulling method allows the safe and reliable growth of the single crystal portion 55 with no breakage of the neck portion 62 even when the diameter and weight of the single crystal portion 55 are increased.

However, in the above-described technique, since the lifting holders 61 approach the corrugated portion 63 in a lateral direction to hold it, a lateral force is likely to act on the corrugated portion 63, causing the single crystal portion 55 to shake with a resultant occurrence of dislocation therein.

Also, when the lifting holders 61 completely replace the seed chuck 51 as pulling means, and a load imposed on the seed chuck 51 becomes zero, the wire used to pull the seed chuck 51 is likely to slacken, potentially damaging the neck portion 62.

In a conventional crystal pulling apparatus having a single pulling mechanism, a detected length of pulling by the pulling mechanism indicates a vertical position of the seed chuck 51 as well as the length of a grown single crystal. By contrast, in the above-described technique involving two pulling mechanisms, the respective lengths of pulling by the two pulling mechanisms must be added. Also, when the wire slackens, it is difficult to accurately measure the length of pulling by the seed chuck 51. Thus, the sum of these measurements is likely to involve an error.

Further, when the pulling by the seed chuck 51 is switched to the pulling by the lifting holders 61, the pulling speed of the seed chuck 51 is varied so as to control the diameter. Therefore, operating conditions such as time required to switch the pulling by the seed chuck 51 to the pulling by the lifting holders 61 are not stable.

Under the above circumstances, there has been eager demand for means which allows the lifting holders 61 to gently hold the corrugated portion without applying a lateral force thereto, which maintains the wire used to pull the seed chuck 51 in a taut state even after the pulling means is switched from the seed chuck 51 to the pulling by the lifting holders 61, and which can accurately measure the length of a grown single crystal.

SUMMARY OF THE INVENTION

An object of the present invention is to provide a method and an apparatus for pulling a single crystal, which allow lifting holders to gently hold a corrugated portion of the single crystal without applying a lateral force thereto, which can maintain a wire used to pull a seed chuck in a taut state even after pulling by the seed chuck is switched to pulling by the lifting holders, and which can accurately measure the length of the pulled single crystal.

In order to achieve the above object, the present invention provides a crystal pulling method comprising the steps of: forming a first neck portion, a convex portion, and a second neck portion, in this order under a seed crystal held by a seed chuck; growing, subsequent to the second neck portion, a single crystal having a diameter-expanding portion and a straight cylindrical portion; bringing lifting holders around and in proximity to the second neck portion when the second neck portion rises to a predetermined position during pulling by the seed chuck; moving the single crystal and the lifting holders relative to each other in the vertical direction to thereby bring the convex portion into contact with the lifting holders in a resting manner; and shifting part of a load borne by the seed chuck to the lifting holders to thereby conduct subsequent pulling by the lifting holders.

As described above, when the second neck portion rises to a predetermined position, the lifting holders are brought around and in proximity to the second neck portion. Next, the convex portion located above the second neck portion is lowered relative to the lifting holders to rest thereon.

Thus, no lateral force is applied to a single crystal, so that defects such as dislocation are less likely to occur.

During this shift of pulling means, not all of the load is shifted to the lifting holders, but part of the load is left on the seed chuck to thereby prevent the wire from slackening. Thus, a breakage of a neck portion or a like damage can be avoided.

Preferably, the convex portion and the second neck portion are intentionally formed through control of the pulling speed of a single crystal or the temperature of a melt in a crucible or both. Also, preferably, in order to form the first neck portion, the convex portion, and the second neck portion into respective predetermined diameters, the pulling speed of a single crystal or the temperature of a melt in a crucible or both are automatically controlled.

The convex portion subsequent to the first neck portion is intentionally formed into a size capable of resting on the lifting holders. The second neck portion is intentionally formed into a diameter capable of withstanding the weight of a crystal to be grown and smaller in size than the convex portion.

These conditions of size are attained through control of either the pulling speed of a single crystal or the temperature of a melt in a crucible or both.

Preferably, during switching from pulling by the seed chuck to pulling by the lifting holders, the rising speed Vb of the lifting holders and the rising/lowering speed Va of the seed chuck relative to the lifting holders are controlled such that the relation "crystal pulling speed V=Vb+Va=constant" is maintained, where Va takes a positive value when the seed chuck is raised and takes a negative value when the seed chuck is lowered.

As described above, even during the shift of crystal pulling means, the pulling speed is maintained at a constant speed, whereby a single crystal of stable quality can be grown through establishment of uniform conditions.

Preferably, the load borne by the seed chuck is measured, and when the measured load reaches a predetermined value or a predetermined ratio to the load borne by the seed chuck as measured before the pulling by the seed chuck is switched to the pulling by the lifting holders, control is started for bringing the relative rising/lowering speed Va of the seed chuck to zero and for bringing the rising speed Vb of the lifting holders to V.

In this case, a sufficient load to keep the wire taut, for example approximately 50% of the load borne by the seed chuck as measured before the pulling by the seed chuck is switched to the pulling by the lifting holders, is left on the seed chuck. As a result of the wire being kept taut, the length of a grown single crystal can be accurately obtained.

Preferably, when the single crystal and the lifting holders are moved relative to each other in the vertical direction, with the crystal pulling speed V being kept constant, the rising speed of the lifting holders is gradually increased from zero, and the seed chuck is lowered relative to the lifting holders. Also, preferably, when the seed chuck is lowered relative to the lifting holders, the lowering speed of the seed chuck is kept constant irrespective of the crystal pulling speed. Further, preferably, the speed of the lifting holders and the speed of the seed chuck are automatically controlled to switch the pulling by the seed chuck to the pulling by the lifting holders.

As described above, by lowering the seed chuck at a constant speed relative to the lifting holders, the pulling means switching time can be made constant to thereby smoothly rest the convex portion on the lifting holders with no impact involved.

Preferably, the respective positions of the seed chuck and the lifting holders are detected so as to accurately calculate therefrom the length and the position of a grown single crystal.

In this case, since the wire is kept taut, the position of the single crystal can be accurately obtained from the position of the seed chuck. The thus-obtained positional value of the single crystal is added to the positional value of the lifting holders to thereby accurately obtain the length of the pulled single crystal.

Preferably, through detection of the position of the seed chuck, there is determined the fact that the convex portion formed at the surface of a melt has reached a predetermined vertical position, to thereby automatically initiate the pulling means switching operation at the predetermined vertical position.

That is, the lifting holders are previously positioned at a predetermined vertical position, and when the convex portion passes this predetermined vertical position, the lifting holders are driven so as to be brought around and in proximity to the second neck portion.

The present invention provides a crystal pulling apparatus which forms a first neck portion, a convex portion, and a second neck portion, in this order under a seed crystal held by a seed chuck, and which grows, subsequent to the second neck portion, a single crystal having a diameter-expanding portion and a straight cylindrical portion and in which during pulling by the seed chuck, part of a load of the single crystal is borne by lifting holders to thereby conduct subsequent pulling by the lifting holders, wherein the lifting holders are brought around and in proximity to the second neck portion when the second neck portion rises to a predetermined position during pulling by the seed chuck, the single crystal and the lifting holders can move relative to each other in the vertical direction by respective lifting mechanisms, and the lifting holders allow the convex portion to rest thereon.

Through use of the above-described apparatus, the lifting holders are brought around and in proximity to the second neck portion at a predetermined point of time, and then the single crystal and the lifting holders are moved relative to each other in the vertical direction to thereby rest the convex portion on the lifting holders.

The present invention provides a crystal pulling apparatus which forms a first neck portion, a convex portion, and a second neck portion, in this order under a seed crystal held by a seed chuck, and which grows, subsequent to the second neck portion, a single crystal having a diameter-expanding portion and a straight cylindrical portion and in which during pulling by the seed chuck, part of a load of the single crystal is borne by lifting holders to thereby conduct subsequent pulling by the lifting holders. The crystal pulling apparatus comprises a crucible for containing a melt of a semiconductor material; a slider which is disposed above the crucible and is vertically moved by a slider moving mechanism; a retaining case provided on the slider and rotatable about a vertical axis; a rotation mechanism for rotating the retaining case; a seed chuck lifting mechanism provided on the retaining case side and used for vertically moving the seed chuck; load measurement means for measuring a load applied to the seed chuck; lifting holders provided on the retaining case side and capable of being brought around and in proximity to the second neck portion; a lifting-holders drive mechanism for bringing the lifting holders in proximity to or moving away from the second neck portion; and a controller connected to the slider moving mechanism, the rotation mechanism, the seed chuck lifting mechanism, the load measurement means, and the lifting-holders drive mechanism and performing synchronous control thereof, whereby during the pulling by the seed chuck is switched to the pulling by the lifting holders, the crystal pulling speed V is maintained at a constant speed.

Preferably, position detectors are provided to detect the respective positions of the seed chuck and the lifting holders.

Based on the respective positions of the seed chuck and the lifting holders as detected by these position detectors, the length of a grown single crystal is calculated.

Preferably, the rising speed Vb of the lifting holders is controlled by a diameter controller.

Of course, the control of the rising speed Vb of the lifting holders is initiated after the lifting holders start rising.

BRIEF DESCRIPTION OF THE DRAWINGS

FIGS. 4A–4C are views showing a pulling means switching operation, wherein

DESCRIPTION OF THE PREFERRED EMBODIMENTS

Embodiments of the present invention will now be described in detail with reference to the drawings.

The crystal pulling apparatus of the present invention employs the Czochralski method (CZ method) for growing a crystal of, for example, a semiconductor material such as silicon, and is suited for safely manufacturing heavy single crystals with no occurrence of dislocation. First, the basic structure of the crystal pulling apparatus will be described with reference to FIGS. 1 and 2.

Figure 1:
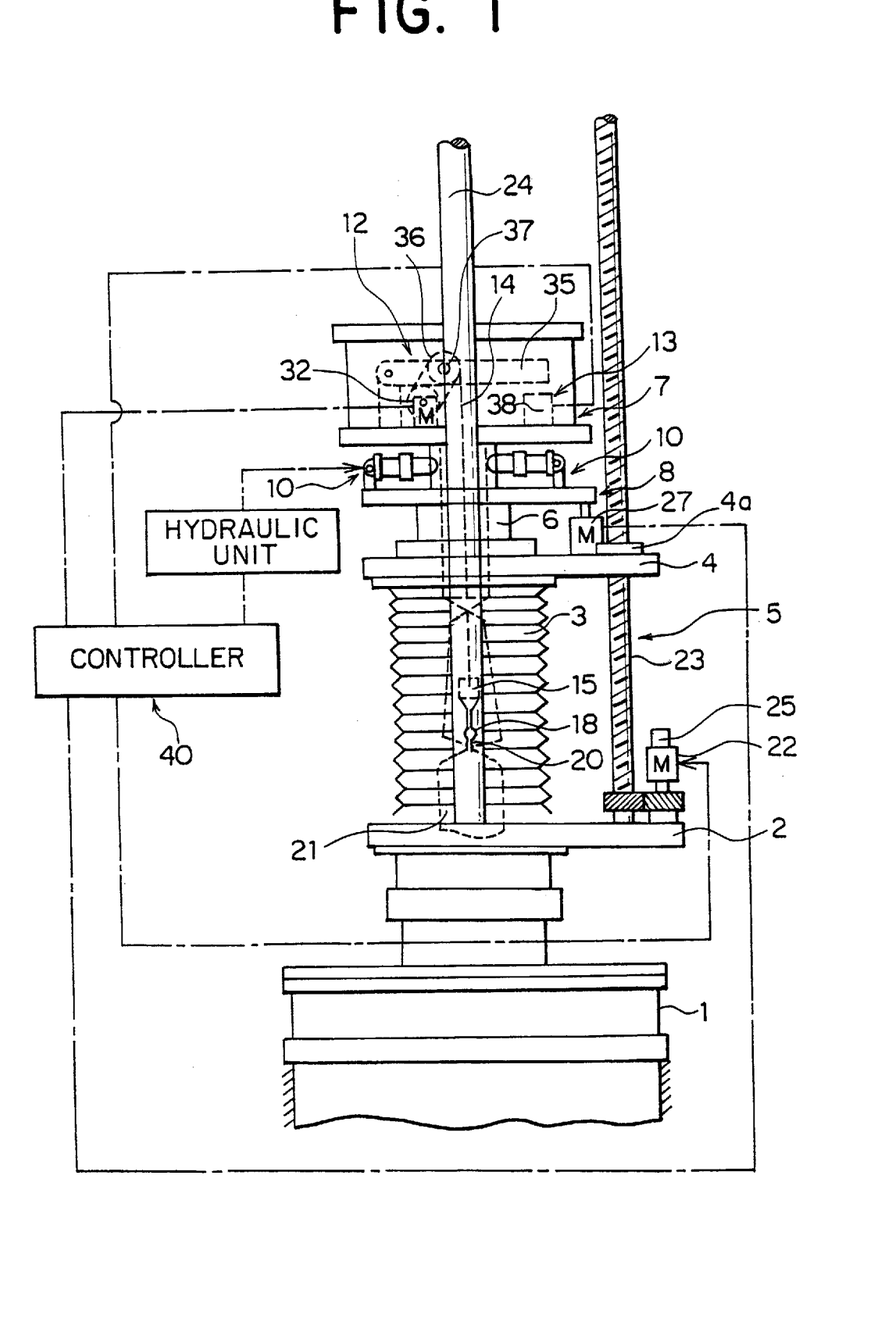
FIG. 1 is a schematic view showing the overall structure of a crystal pulling apparatus according to an embodiment of the present invention.

The crystal pulling apparatus comprises a lower chamber 1 which contains an unillustrated crucible, a fixed plate 2 fixed above the lower chamber 1, and a slider 4 which is mounted on the fixed plate 2 via bellows chamber 3. The slider 4 is vertically moved by a slider moving mechanism 5. On the slider 4, a retaining case 7 is rotatably supported by a cylindrical retainer 6.

Figure 2:
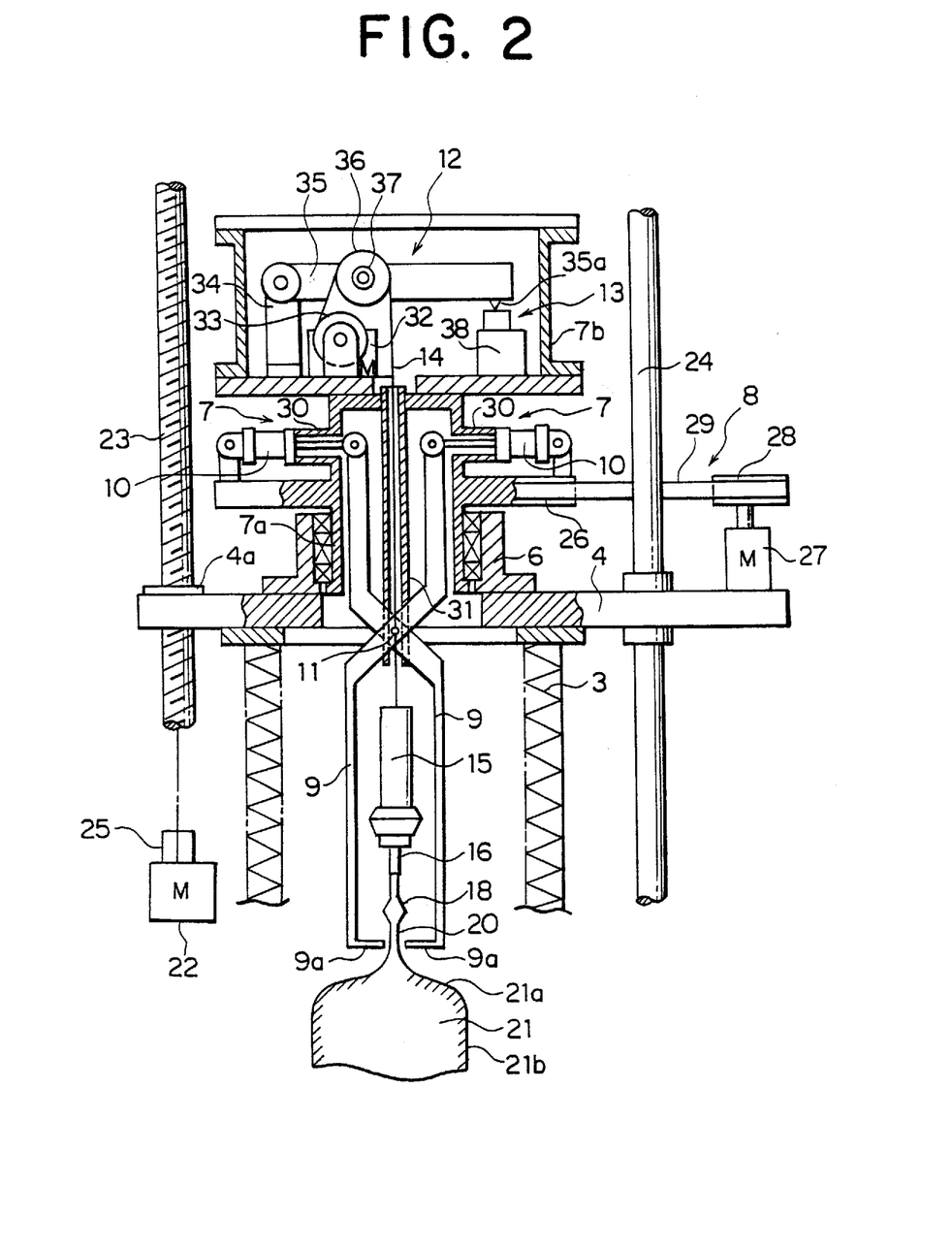
FIG. 2 is a partial vertical sectional view showing the detailed structure of a seed chuck, lifting holders, and neighboring portions.

As shown in FIG. 2, the retaining case 7 comprises a lower first retaining case 7a and an upper second retaining case 7b, which are integrally connected. The lower first retaining case 7a is equipped with a rotation mechanism 8 for rotating the retaining case 7 about a vertical axis. A pair of lifting holders 9 are provided in the first retaining case 7a. The upper end portions of the lifting holders 9 are linked to hydraulic cylinder units 10 serving as a lifting-holders drive mechanism. The lifting holders 9 cross at intermediate portions thereof, where the crossing lifting holders 9 are pivotally supported by a pin 11.

The upper second retaining case 7b is provided with a seed chuck lifting mechanism 12 and load measurement means 13 for measuring a load applied to a seed chuck. The seed chuck lifting mechanism 12 retains a seed chuck 15 attached to the bottom end portion of a wire 14 in a vertically movable manner. The seed chuck 15 holds a seed crystal 16.

Figure 3:
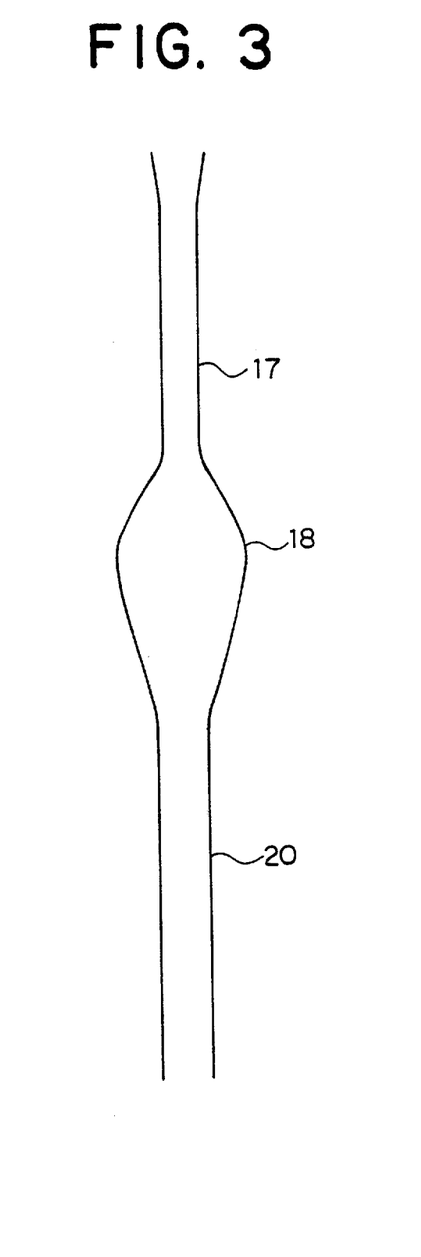
FIG. 3 is an enlarged view showing a convex portion.

In the process of bringing the seed crystal 16 into contact with a material melt and then pulling the seed crystal 16 to grow a single crystal, a first neck portion 17 is formed to prevent the occurrence of dislocation in a grown single crystal, and then a convex portion 18 and a second neck portion 20 are formed, as shown in FIG. 3. Subsequently, a single crystal portion 21 comprising a diameter-expanding portion 21a and a straight cylindrical portion 21b as shown in FIG. 2 is formed.

The bellows chamber 3 is formed of a pleated sheet of metal, such as stainless steel or titanium, in a vertically expandable manner, and is communicated with the lower chamber 1 to isolate the interior thereof from the ambient atmosphere. The bellows chamber 3 expands when a single crystal is pulled. Also, this expandable characteristic of the bellows chamber 3 is utilized when a grown single crystal is taken out from the crystal pulling apparatus.

The slider moving mechanism 5 comprises a lifting drive motor 22, a ball screw 23 to be rotated by the lifting drive motor 22, and a guide shaft 24 disposed upright on the fixed plate 2. The ball screw 23 engages with a nut portion 4a of the slider 4, and the guide shaft 24 is slidably inserted through a guide hole in the slider 4. As the ball screw 23 rotates, the slider 4 moves vertically.

A slider position detector 25 is provided in the vicinity of the lifting drive motor 22 so as to detect the position of the slider 4 from, for example, the number of revolutions of the motor 22.

The rotation mechanism 8 is intended to rotate the retaining case 7 about a vertical axis and comprises, as shown in FIG. 2, a large-diameter pulley 26 provided integrally on the outer circumference of the lower first retaining case 7a at an intermediate portion thereof, a motor 27 fixed on the slider 4 at an end portion thereof, a small-diameter pulley 28 attached to the output shaft of the motor 27, and an endless belt 29 fitted around and extending between the large-diameter pulley 26 and the small-diameter pulley 28. As the motor 27 operates, the retaining case 7 rotates.

The upper end portions of the lifting holders 9 are pivotally connected to the hydraulic cylinder units 10, which serve as a lifting-holders drive mechanism and are fixed to corresponding hollow bossing portions 30 of the first retaining case 7a. As mentioned previously, the lifting holders 9 cross at intermediate portions thereof and are pivotally supported at the intermediate portions thereof by the slider 4 via the pin 11. Holder portions 9a are formed at the bottom end portions of the lifting holders 9.

The holder portions 9a are opened/closed through operation of the hydraulic cylinder units 10. The inner edges of the holder portions 9a are, for example, semicircularly curved, so that the holder portions 9a form a ring when they are closed to contact each other. The inner diameter of the ring is set to be larger than that of the second neck portion 20 and smaller than that of the convex portion 18.

A guide tube 31 through which the wire 14 is passed is vertically disposed within the first retaining case 7a along the center axis thereof, thereby preventing the wire 14 from interfering with the lifting holders 9 and other portions.

The seed chuck lifting mechanism 12 comprises a pulley 33 rotated by a motor 32 mounted on the bottom plate of the upper second retaining case 7b, a lever 35 which is pivotally supported in a cantilevering manner by a support 34 mounted upright on the bottom plate, and a guide pulley 36 pivotally supported by the lever 35 at an intermediate portion of the lever 35. The wire 14 is looped around the guide pulley 36 and is wound onto the pulley 33. As the motor 32 operates, the seed chuck 15 is vertically moved via the wire 14.

A wire position detector 37 is provided in the vicinity of the guide pulley 36 so as to detect the position of a seed chuck 15 through detection of, for example, revolutions of the guide pulley 36.

The load measurement means 13 comprises a pivot 35a provided at the tip of the lever 35 and a load cell 38 which supports the pivot 35a, thereby measuring a load which has a predetermined ratio to a crystal weight imposed on the guide pulley 36.

A controller 40 is connected to the lifting drive motor 22 of the slider moving mechanism 5, the motor 27 of the rotation mechanism 8, the motor 32 of the seed chuck lifting mechanism 12, the load cell 38 of the load measurement means 13, and the hydraulic cylinder unit 10 serving as a lifting-holders drive mechanism, to thereby control them synchronously.

Also, the slider position detector 25 located in the vicinity of the lifting drive motor 22 and the wire position detector 37 located in the vicinity of the guide pulley 36 of the seed chuck lifting mechanism 12 are connected to the controller 40, so that detection signals can be sent to the controller 40.

A method of pulling a single crystal through use of a crystal pulling apparatus having the above-described structure will now be described.

First, the seed crystal 16 held by the seed chuck 15 is brought into contact with the surface of a material melt contained in a crucible. Then, the wire 14 is pulled at a predetermined speed by the seed chuck lifting mechanism 12 while the retaining case 7 is gently rotated through operation of the motor 27 of the rotation mechanism 8. Through control of the pulling speed of the seed crystal 16 or the temperature of the melt in the crucible or both, the first neck portion 17, the convex portion 18, and the second neck portion 20 are formed, in this order subsequent to the seed crystal 16, as shown in FIG. 3. In this case, the diameter of the convex portion 18 is set to be larger than the inner diameter of the ring formed by the closed holder portions 9a of the lifting holders 9, and the diameter of the second neck portion 20 is set to be smaller the inner diameter of the ring formed by the closed holder portions 9a. In the present embodiment, the diameter of the first neck portion 17 is approximately 4 mm, the maximum diameter of the convex portion 18 is approximately 25 mm, and the diameter of the second neck portion 20 is approximately 7 mm.

Next, through adjustment of the pulling speed, the temperature of a melt, etc., the single crystal portion 21 comprising the diameter-expanding portion 21a and the straight cylindrical portion 21b is grown, and the motor 32 of the seed chuck lifting mechanism 12 is operated to raise the seed chuck 15 at a predetermined crystal pulling speed V.

Figure 4A:
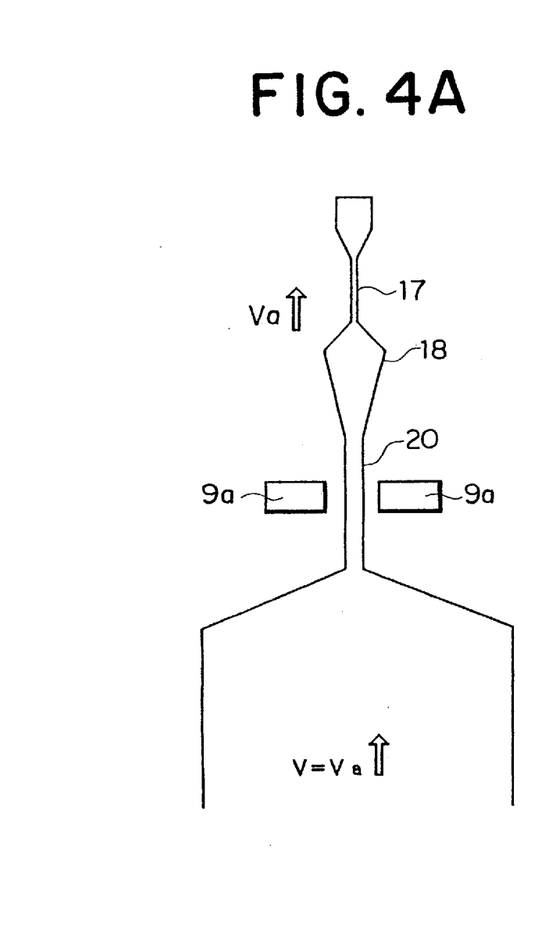
FIG. 4A is a view showing the state in which the pulling means switching operation has started.

When the seed chuck 15 is raised to a predetermined position as measured from a point where the convex portion 18 was formed, the controller 40 causes the hydraulic cylinder units 10 to operate, so that the lifting holders 9 swing about the pin 11 to thereby close the holder portions 9a. At this time, as shown in FIG. 4A, the holder portions 9a are brought around and in proximity to the second neck portion 20.

Figure 5:
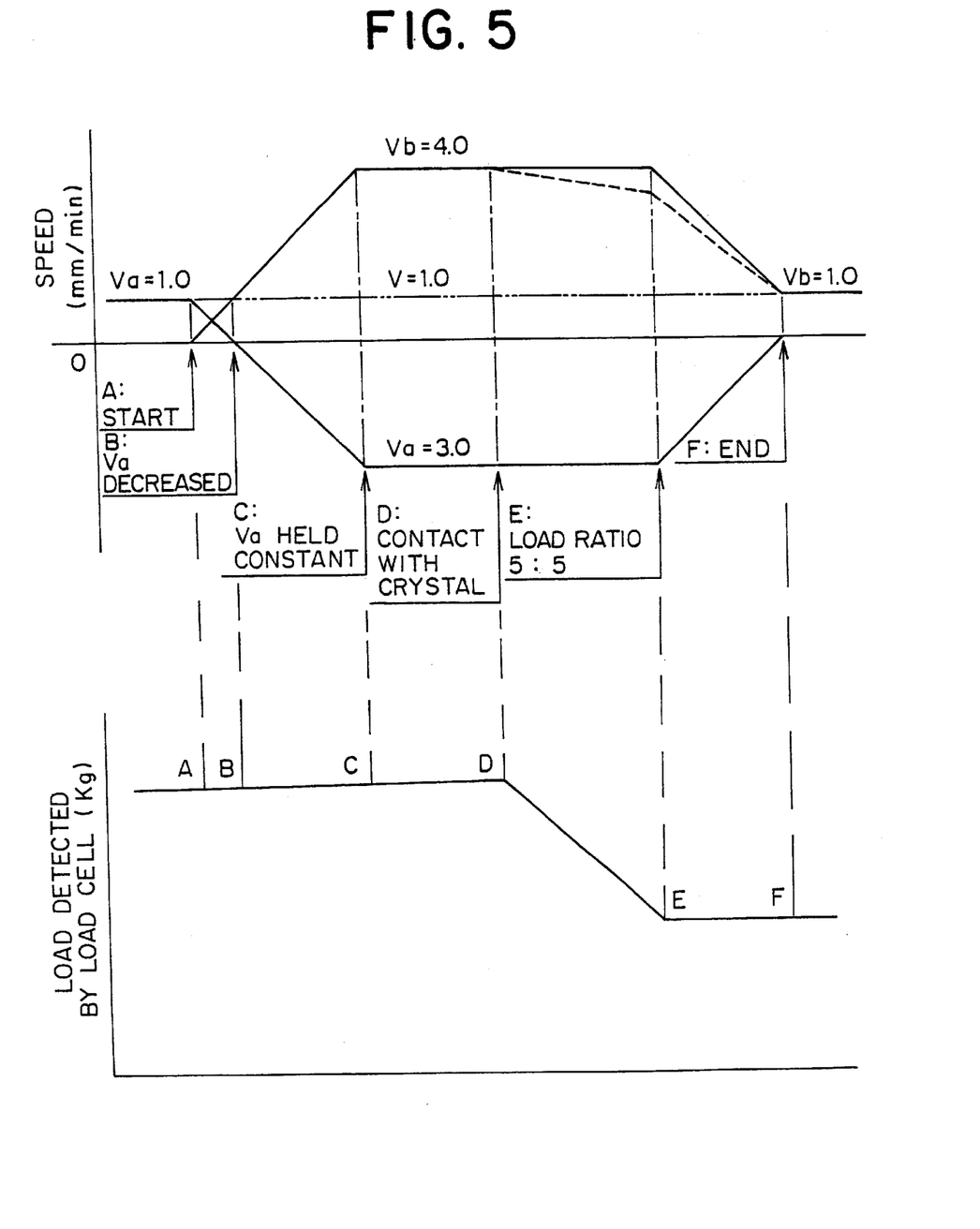
FIG. 5 is a combination of a graph showing variations in the respective speeds of the seed chuck and the lifting holders and a graph showing the shift of load.

When the holder portions 9a are closed, the pulling means switching operation is initiated. Thus, the lifting drive motor 22 of the slider moving mechanism 5 starts to operate, and consequently the lifting holders 9 begin to gradually rise, and at the same time the seed chuck 15 begins to gradually decelerate. Speed variations after the pulling means switching operation is started are shown in the upper graph of FIG. 5. In FIG. 5, point A indicates a starting point of the pulling means switching operation.

FIG. 5 shows variations in the respective moving speeds of the seed chuck 15 and the lifting holders 9 (upper graph) and the shift of load (lower graph). In FIG. 5, the axis of abscissa represents time (min), while the axis of ordinate represents a speed in mm/min in the upper graph and a load in kg in the lower graph.

In the present embodiment, the moving speed Va of the seed chuck 15 relative to the lifting holders 9 gradually decreases from the initial pulling speed, V=1.0 (mm/min), such that it becomes zero at point B. Subsequently, the seed chuck 15 is lowered relative to the lifting holder 9, and the moving speed Va is increased until the moving speed reaches −3.0 (mm/min) at point C. After the point C, the lowering speed Va is maintained at −3.0 (mm/min). By contrast, the rising speed Vb of the lifting holders 9 gradually increases from zero such that it becomes 4.0 (mm/min) at the point C and is subsequently maintained at 4.0 (mm/min). During this period ranging from the point A to the point C, the ratio between the rising speed Vb of the lifting holders 9 and the relative moving speed Va of the seed chuck 15 is controlled such that their sum V (V=Vb+Va) becomes constant, where Va takes a positive value when the seed chuck 15 is raised and takes a negative value when the seed chuck 15 is lowered. This speed V is the absolute pulling speed of a single crystal and is identical to the pulling speed of a single crystal as observed before the pulling means switching operation has been initiated. Of course, the relation "Vb+Va=V=constant" is maintained after the point C until the pulling means switching operation is completed.

Figure 4B:
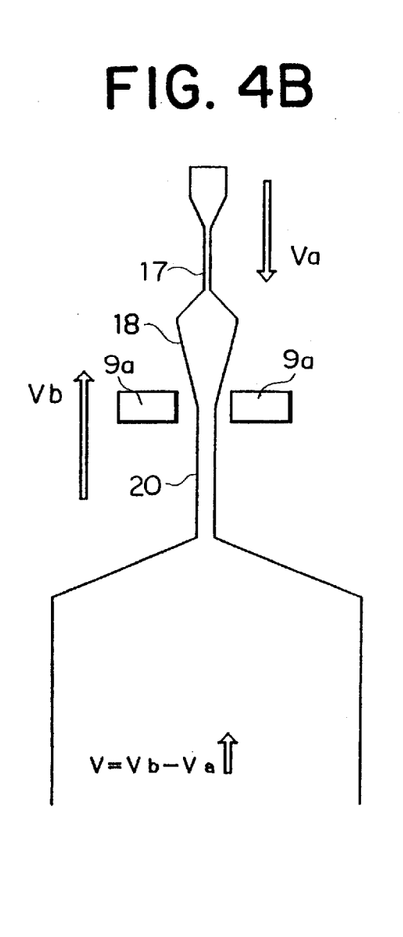
FIG. 4B is a view showing the state in which the pulling means switching operation is in progress.

During the pulling means switching operation, the seed chuck 15 and the lifting holders 9 have a positional relationship therebetween, as shown in FIG. 4B. In this case, during the period ranging from the point A to the point C in FIG. 5, the rate of speed change (i.e. time required to complete speed change) may be freely selected so long as the requirement "V=constant" is satisfied.

In the course of the seed chuck 15 lowering relative to the lifting holders 9, the convex portion 18 contacts and rests on the upper sections of the holder portions 9a (at point D).

At this time, the seed chuck 15 contacts the lifting holders 9 at a speed identical to the lowering speed −Va of the seed chuck 15, i.e. the convex portion 18 contacts the holder portions 9a at this speed. However, since the direction of contact is vertical, no lateral force acts on the single crystal portion 21, and thus defects such as dislocation are less likely to occur.

After the contact of the convex portion 18 with the holder portions 9a, in order to shift the load borne by the seed chuck 15 to the holder portions 9a, the previous moving conditions are maintained. Thereupon, as shown in the lower graph of FIG. 5, the load imposed on the seed chuck 15 (a load (kg) detected by the load cell 38) begins to decrease to thereby shift part of the load to the holder portions 9a.

Subsequently, when the load imposed on the seed chuck 15 decreases in an amount of 50%, i.e. the load ratio between the seed chuck 15 and the lifting holders 9 becomes 5:5 (at point E), control is initiated so as to decrease the rising speed Vb of the lifting holders 9 from the speed at the point E to the crystal pulling speed V (=1.0 mm/min) as well as to bring the lowering speed −Va of the seed chuck 15 back to zero. Also, during this control, the speeds Vb and −Va are controlled such that the condition "V=constant" is maintained. Further, during the period ranging from the point E to point F, the rate of speed change may be freely selected for Va and Vb so long as the requirement "V=constant" is satisfied.

Figure 4C:
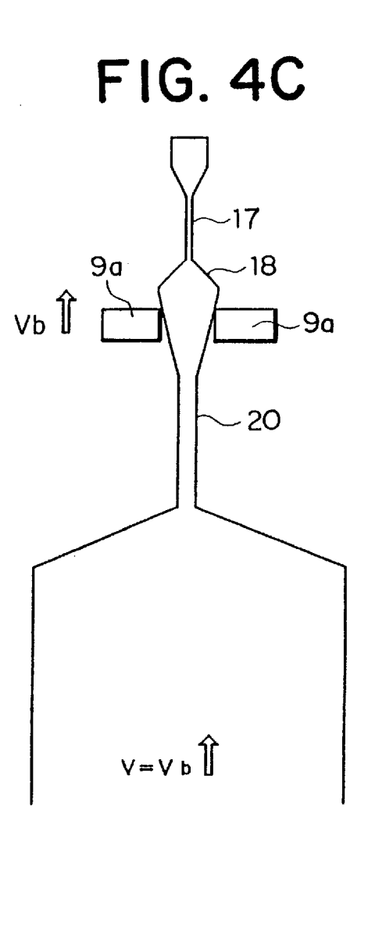
FIG. 4C is a view showing the state in which the pulling means switching operation has completed.

Subsequently to the point F where the pulling means switching operation has been completed, as shown in FIG. 4C, a single crystal is pulled by the lifting holders 9 while the load imposed on the seed chuck 15 at point E is maintained. Thus, in contrast to a conventional crystal pulling apparatus, the wire 14 connected to the seed chuck 15 does not slacken, thereby preventing damage to the first neck portion 17 which would otherwise result from the slack wire 14.

The above-described shift of pulling means was experimentally confirmed. The experiment has revealed that if Vb and Va are kept constant during the period ranging from the point D to the point E (FIG. 5) where the load ratio between the seed chuck 15 and the lifting holders 9 shifts to 5:5, the relation "Vb±Va=V=constant" may not be established in a strict sense in some cases. In such a case, the rising speed Vb of the lifting holders 9 must be corrected so as to maintain the crystal pulling speed v at a constant speed. An example of the thus-corrected Vb is represented by the dashed line shown in the upper graph of FIG. 5.

During the above-described shift of pulling means, when there arises the necessity to change the crystal pulling speed V, according to a signal from a crystal diameter controller, in order to maintain the diameter of a crystal constant, the rising speed Vb of the lifting holders 9 is varied accordingly. Thus, the relative moving speed ±Va of the seed chuck 15 is always held constant, so that operating conditions such as elapsed time can be rendered constant during the period ranging from the point A, where the pulling means switching operation starts, to the point D, where the lifting holders hold a crystal. Hence, the convex portion 18 can smoothly rest on the holder portions 9a with no impact involved.

Since the wire 14 is kept taut, the respective positions of the seed chuck 15 and the lifting holders 9 can be accurately detected through use of the wire position detector 37 and the slider position detector 25, respectively. Thus, the length of a grown crystal can be accurately measured from these detected values.

The present invention is not limited to the above-described embodiments. The above-described embodiments are mere examples, and those having the substantially same structure as that described in the appended claims and providing the similar action and effects are included in the scope of the present invention.

For example, in the above-described embodiments, when the load borne by the seed chuck is shifted to the lifting holders, half of the load is left on the seed chuck to thereby prevent the wire from slackening. However, the present invention is not limited thereto. Any load may be left on the seed chuck so long as the wire is kept taut to thereby prevent damage to a neck portion which would otherwise result from the slack wire.

What is claimed is:

1. A crystal pulling method comprising the steps of:
   forming a first neck portion, a convex portion, and a second neck portion in this order under a seed crystal held by a seek chuck;
   growing, subsequent to the second neck portion, a single crystal having a diameter-expanding portion and a straight cylindrical portion;
   bringing lifting holders around and in proximity to the second neck portion when the second neck portion rises to a predetermined position during the pulling by said seed chuck;
   moving said single crystal and said lifting holders relative to each other in the vertical direction to thereby bring the convex portion into contact with said lifting holders in a resting manner, so that part but not all of a load borne by said seed chuck is shifted to said lifting holders; and
   performing subsequent pulling by said lifting holders and the seed chuck.

2. A crystal pulling method according to claim 1, wherein the convex portion and the second neck portion are intentionally formed through control of the pulling speed of said single crystal or the temperature of a melt in a crucible or both.

3. A crystal pulling method according to claim 1, wherein in order to form the first neck portion, the convex portion, and the second neck portion into respective predetermined diameters, the pulling speed of said single crystal or the temperature of a melt in a crucible or both are automatically controlled.

4. A crystal pulling method according to claim 1, wherein during switching from pulling by said seed chuck to pulling by said lifting holders, the rising speed Vb of the lifting holders and the rising/lowering speed Va of said seed chuck relative to the lifting holders are controlled such that the relation "crystal pulling speed V=Vb+Va=constant" is maintained, where Va takes a positive value when said seed chuck is raised and takes a negative value when said seed chuck is lowered.

5. A crystal pulling method according to claim 4, wherein the load borne by said seed chuck is measured, and when the measured load reaches a predetermined value or a predetermined ratio to the load borne by said seed chuck as measured before pulling by said seed chuck is switched to pulling by said lifting holders, control is started for bringing the relative rising/lowering speed Va of said seed chuck to zero and for bringing the rising speed Vb of said lifting holders to V.

6. A crystal pulling method according to claim 1, wherein when said single crystal and said lifting holders are moved relative to each other in the vertical direction, with the crystal pulling speed V being kept constant, the rising speed of said lifting holders is gradually increased from zero, and said seed chuck is lowered relative to said lifting holders.

7. A crystal pulling method according to claim 6, wherein when said seed chuck is lowered relative to said lifting holders, the lowering speed of said seed chuck is kept constant irrespective of the crystal pulling speed.

8. A crystal pulling method according to claim 6, wherein the speed of said lifting holders and the speed of said seed chuck are automatically controlled in order to switch pulling by said seed chuck to pulling by said lifting holders.

9. A crystal pulling method according to claim 1, wherein the respective positions of said seed chuck and said lifting holders are detected so as to accurately calculate therefrom the position and the length of said pulled single crystal.

10. A crystal pulling method according to claim 9, wherein through detection of the position of said seed chuck, there is determined the fact that the convex portion formed at the surface of a melt has reached a predetermined vertical position, to thereby automatically initiate a pulling means switching operation at the predetermined vertical position.

11. A crystal pulling apparatus in which a first neck portion, a convex portion, and a second neck portion are formed in this order under a seed crystal held by a seed chuck; subsequent to the second neck portion, a single crystal having a diameter-expanding portion and a straight cylindrical portion is formed; and a part of said single crystal is held by lifting holders during pulling by said seed chuck so that the pulling is performed by said lifting holders, wherein said lifting holders are brought around and in proximity to the second neck portion when the second neck portion rises to a predetermined position during pulling by said seed chuck; said single crystal and said lifting holders are moved relative to each other in the vertical direction by respective lifting mechanisms; and said lifting holders allow the convex portion to rest thereon so that part but not all of a load borne by said seed chuck is shifted to said lifting holders; and performing subsequent pulling by said lifting holders and the seed chuck.

12. A crystal pulling apparatus in which a first neck portion, a convex portion, and a second neck portion are formed in this order under a seed crystal held by a seed chuck; subsequent to the second neck portion, a single crystal having a diameter-expanding portion and a straight cylindrical portion is formed; and a part of said single crystal is held by lifting holders during pulling by said seed chuck so that part but not all of a load borne by said seed chuck is shifted to said lifting holders; and subsequent pulling is performed by said lifting holders and the seed chuck, said crystal pulling apparatus comprising

- a crucible for containing a melt of a semiconductor material;
- a slider which is disposed above said crucible and is vertically moved by a slider moving mechanism;
- a retaining case provided on said slider and rotatable about a vertical axis;
- a rotation mechanism for rotating said retaining case;
- a seed chuck lifting mechanism provided on said retaining case side and used for vertically moving said seed chuck;
- load measurement means for measuring a load applied to said seed chuck;
- lifting holders provided on said retaining case side and capable of being brought around and in proximity to said second neck portion;
- a lifting-holders drive mechanism for bringing said lifting holders in proximity to or moving away from the second neck portion; and
- a controller connected to said slider moving mechanism, said rotation mechanism, said seed chuck lifting mechanism, said load measurement means, and said lifting-holders drive mechanism and adapted to perform synchronous control thereof, whereby during pulling by said seed chuck is switched to pulling by said lifting holders, the crystal pulling speed V is maintained at a constant speed.

13. A crystal pulling apparatus according to claim 11, wherein position detectors are provided to detect the respective positions of said seed chuck and said lifting holders.

14. A crystal pulling apparatus according to claim 12, wherein position detectors are provided to detect the respective positions of said seed chuck and said lifting holders.

15. A crystal pulling apparatus according to claim 11, wherein the rising speed Vb of said lifting holders is controlled by a diameter controller.

16. A crystal pulling apparatus according to claim 12, wherein the rising speed Vb of said lifting holders is controlled by a diameter controller.

* * * * *